(12) United States Patent
Celaya et al.

(10) Patent No.: US 8,071,427 B2
(45) Date of Patent: Dec. 6, 2011

(54) METHOD FOR MANUFACTURING A SEMICONDUCTOR COMPONENT AND STRUCTURE THEREFOR

(75) Inventors: Phillip Celaya, Gilbert, AZ (US); James P. Letterman, Jr., Mesa, AZ (US); Robert L. Marquis, Greene, RI (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 235 days.

(21) Appl. No.: 12/362,142

(22) Filed: Jan. 29, 2009

(65) Prior Publication Data

US 2010/0187663 A1    Jul. 29, 2010

(51) Int. Cl.
*H01L 21/44* (2006.01)
*H01L 21/48* (2006.01)
(52) U.S. Cl. .. 438/112; 438/123; 257/666; 257/E21.502
(58) Field of Classification Search .................. 438/112, 438/123; 257/666, E23.031
See application file for complete search history.

(56) References Cited

U.S. PATENT DOCUMENTS

| | | | | |
|---|---|---|---|---|
| 5,976,912 A | * | 11/1999 | Fukutomi et al. | 438/110 |
| 6,001,671 A | * | 12/1999 | Fjelstad | 438/112 |
| 6,338,984 B2 | * | 1/2002 | Minamio et al. | 438/123 |
| 6,498,099 B1 | * | 12/2002 | McLellan et al. | 438/689 |
| 6,608,366 B1 | | 8/2003 | Fogelson et al. | |
| 6,638,790 B2 | * | 10/2003 | Minamio et al. | 438/111 |
| 6,841,414 B1 | * | 1/2005 | Hu et al. | 438/106 |
| 7,846,774 B2 | * | 12/2010 | Yee et al. | 438/111 |
| 2002/0144396 A1 | * | 10/2002 | Glenn | 29/841 |
| 2005/0206010 A1 | * | 9/2005 | Noquil et al. | 257/778 |

OTHER PUBLICATIONS

"Soldering the QFN Stacked Die Sensors to a PC Board," by Thomas Koschmieder, Cheol Han, Kimberly Tuck, and John Dixon, Freescale Semiconductor Application Note AN3111, Rev 5, Apr. 2010, 9 pages.

* cited by examiner

*Primary Examiner* — Nitin Parekh
(74) *Attorney, Agent, or Firm* — Rennie William Dover

(57) ABSTRACT

A semiconductor component having wetable leadframe lead surfaces and a method of manufacture. A leadframe having leadframe leads is embedded in a mold compound. A portion of at least one leadframe lead is exposed and an electrically conductive material is formed on the exposed portion. The mold compound is separated to form singulated semiconductor components.

14 Claims, 12 Drawing Sheets

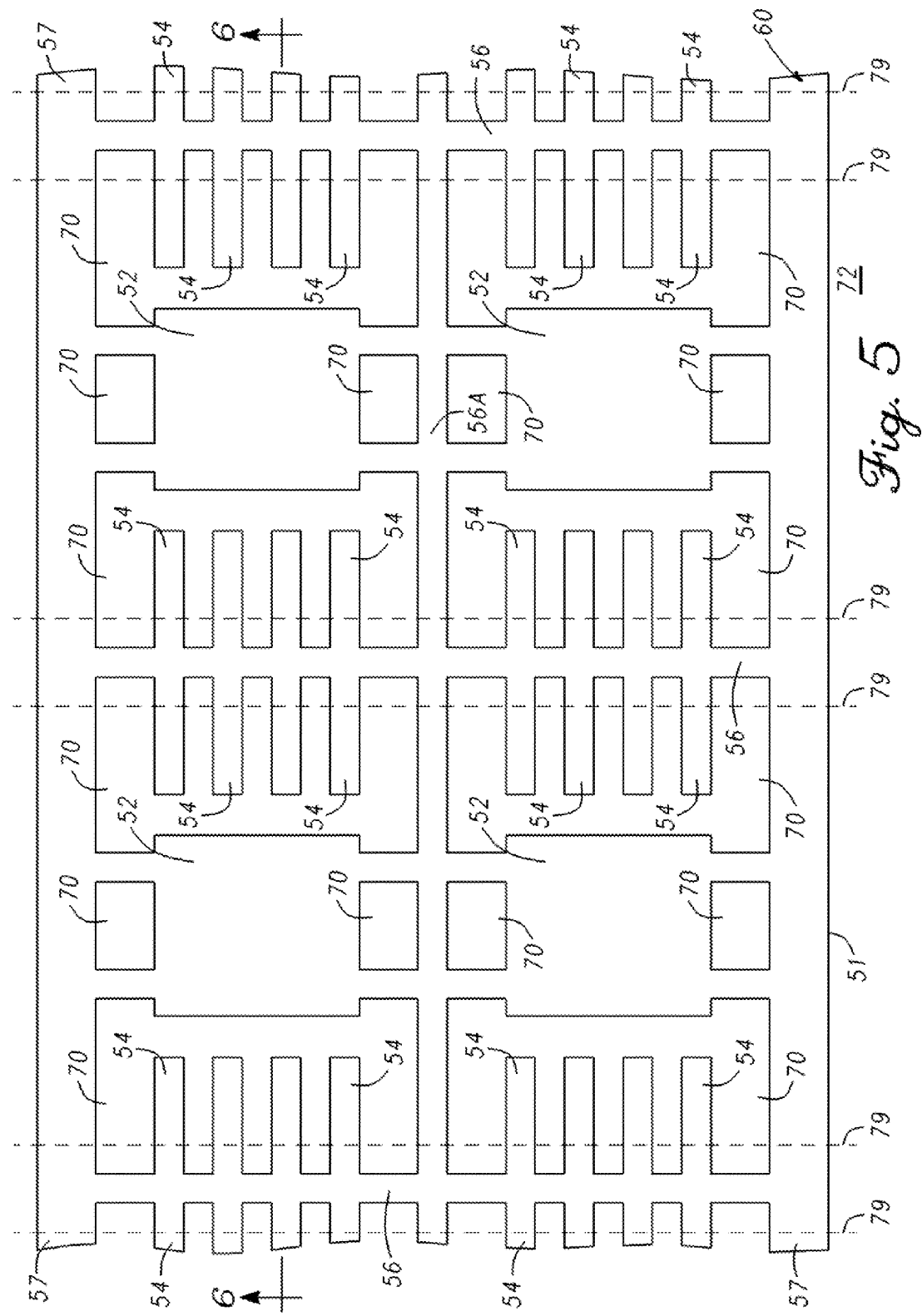

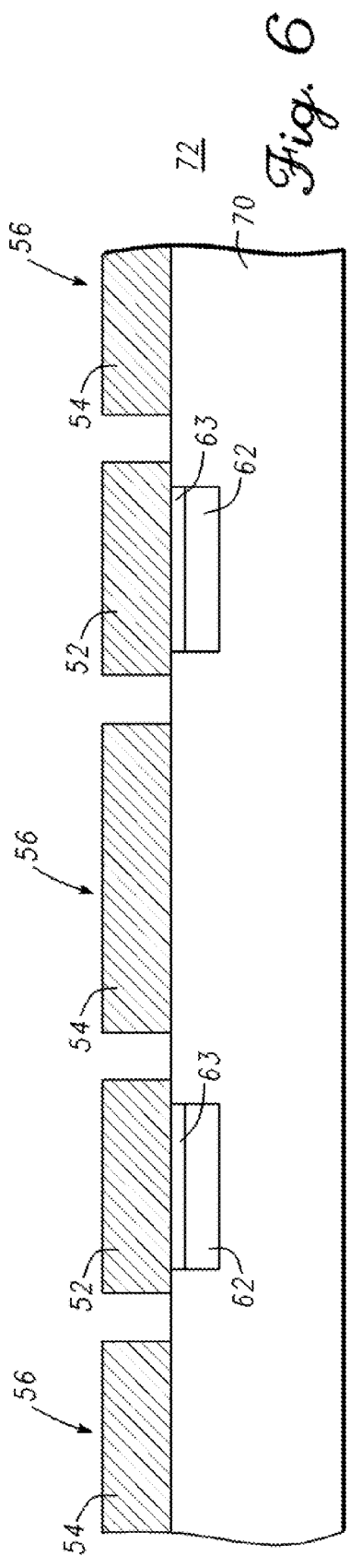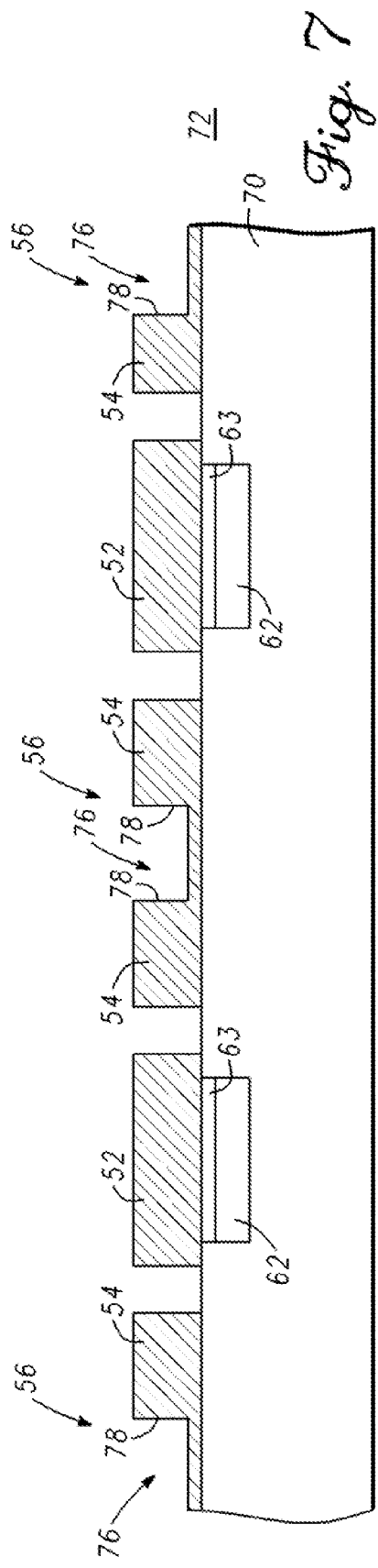

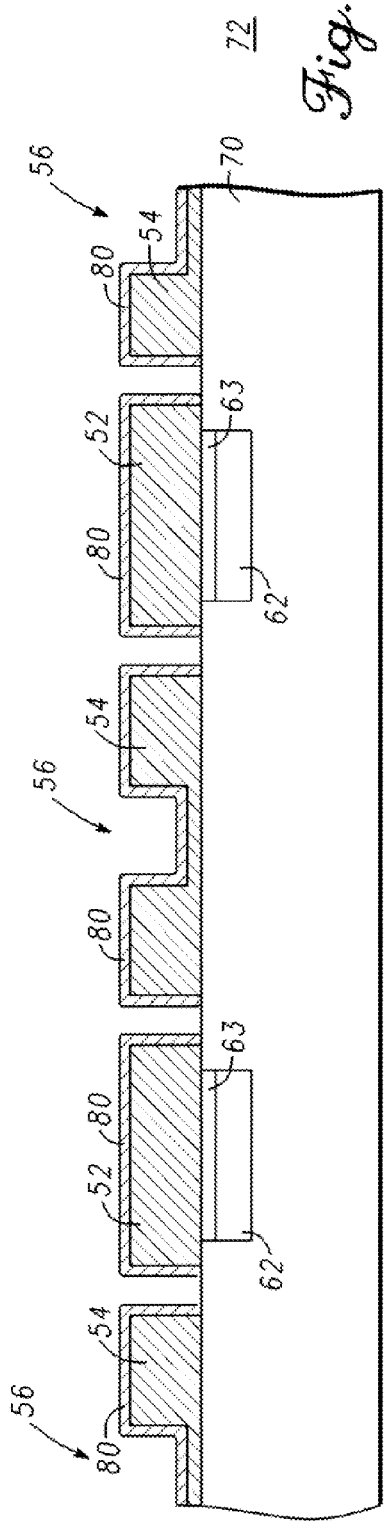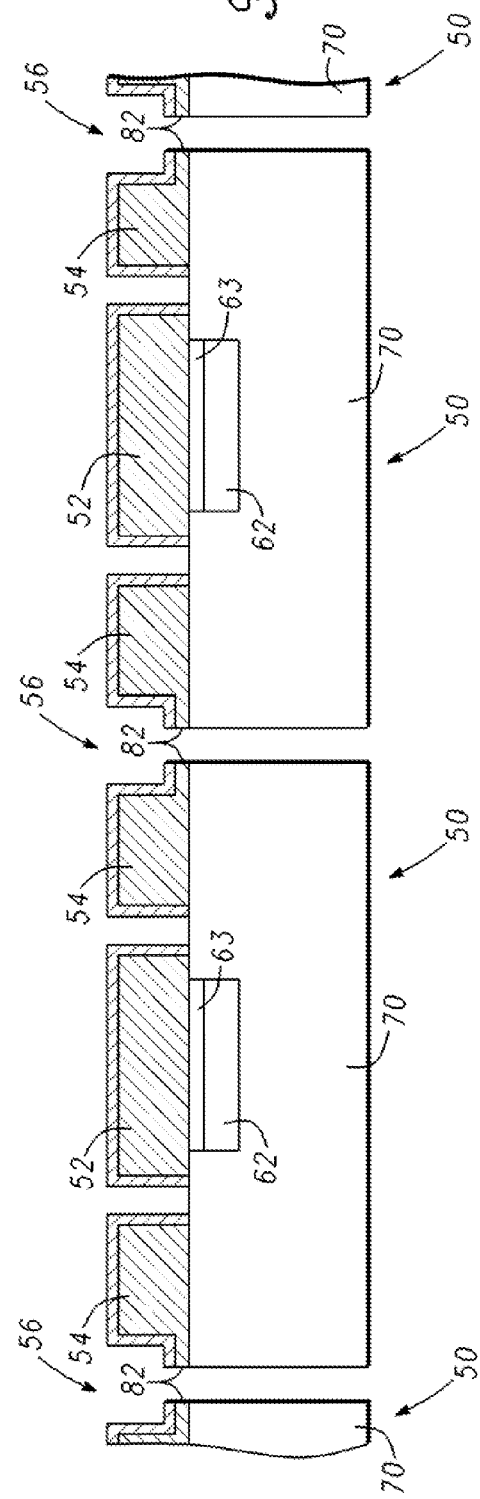

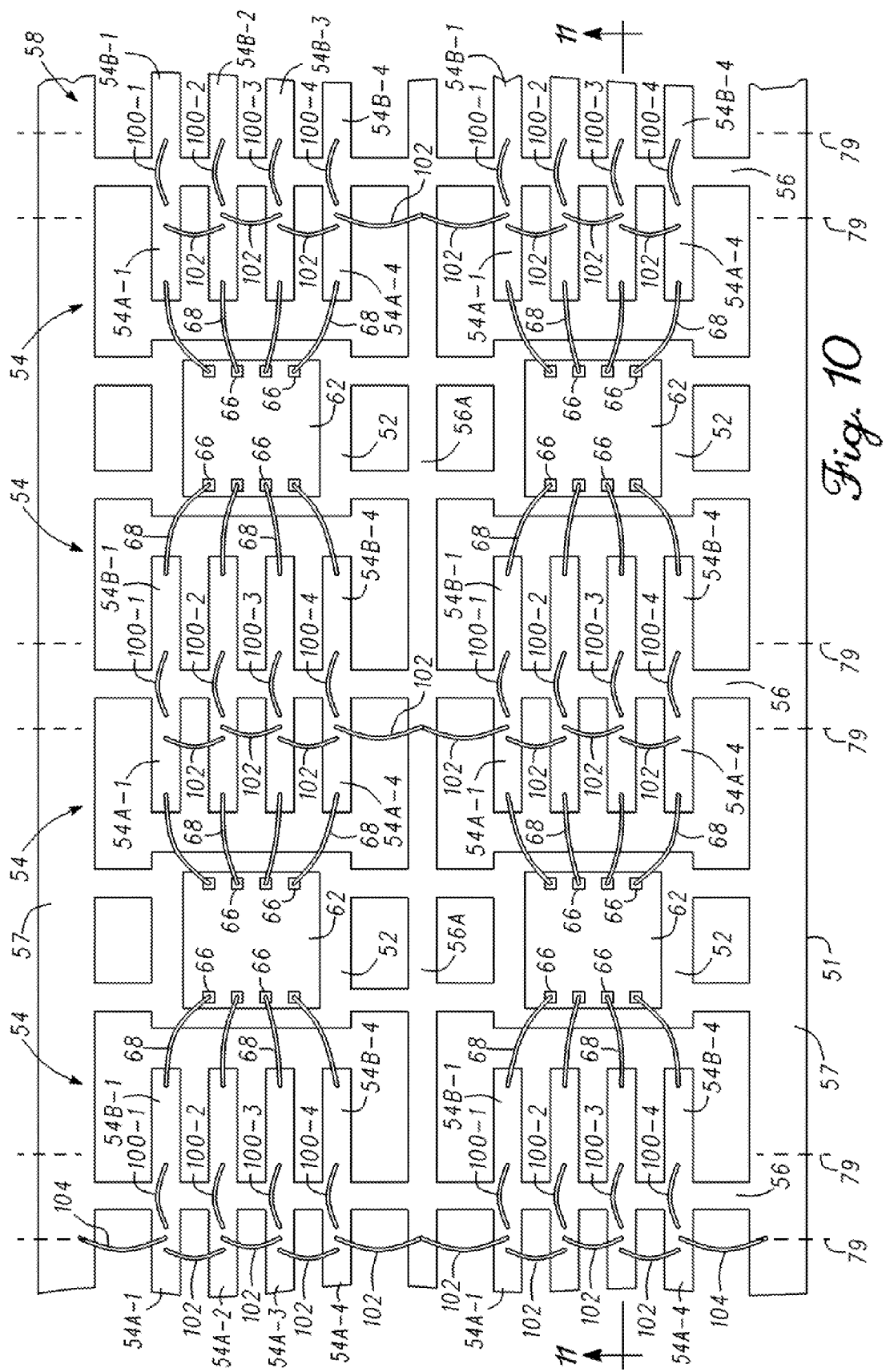

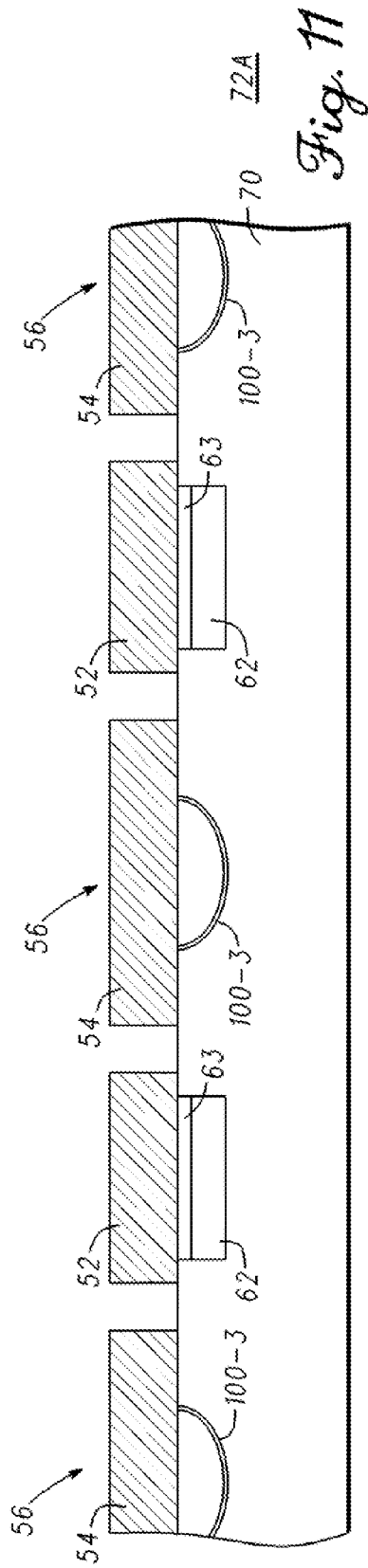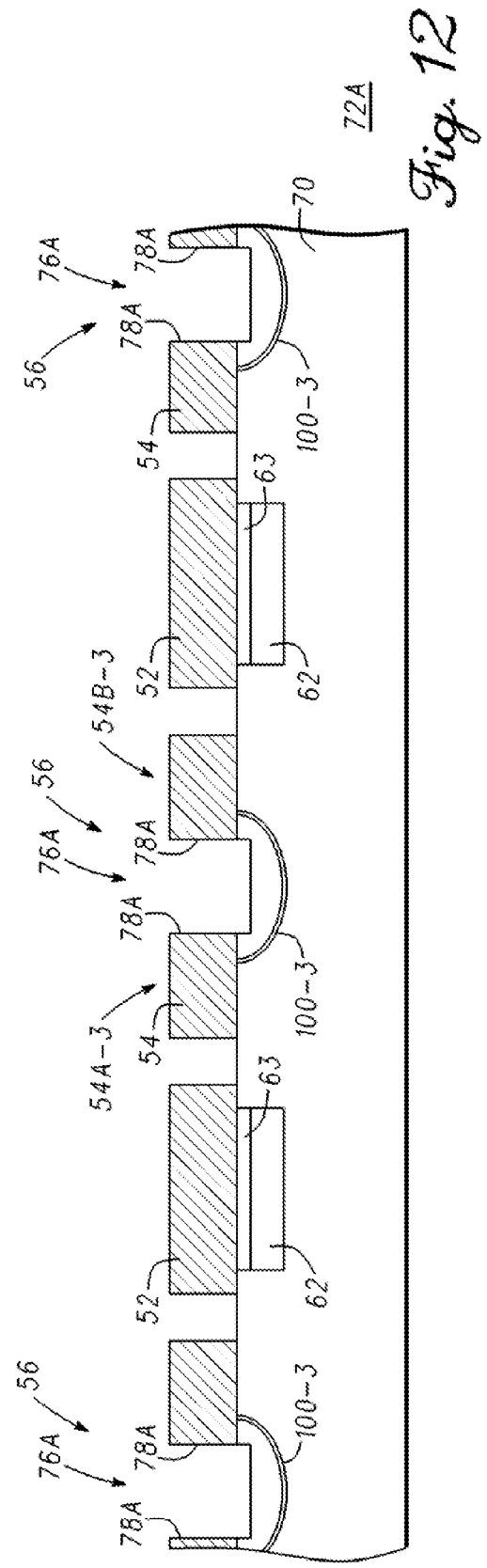

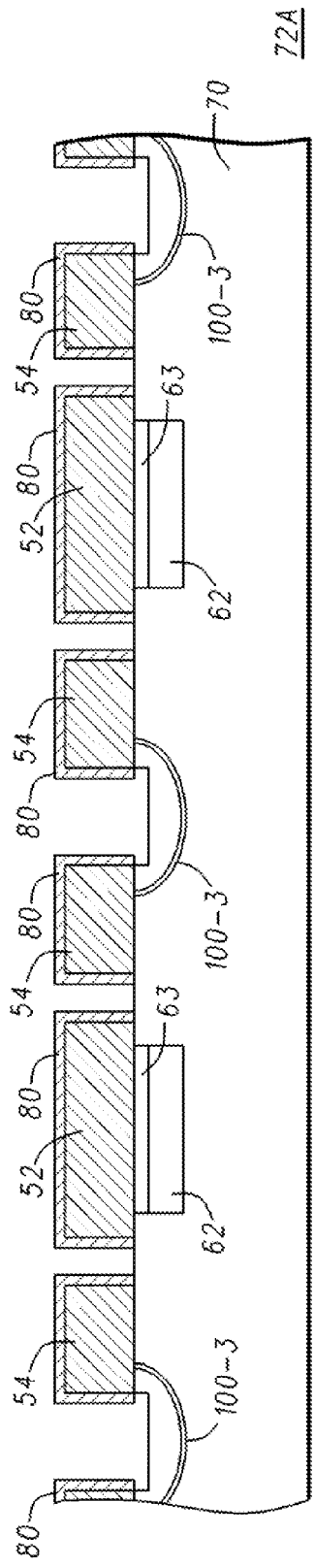
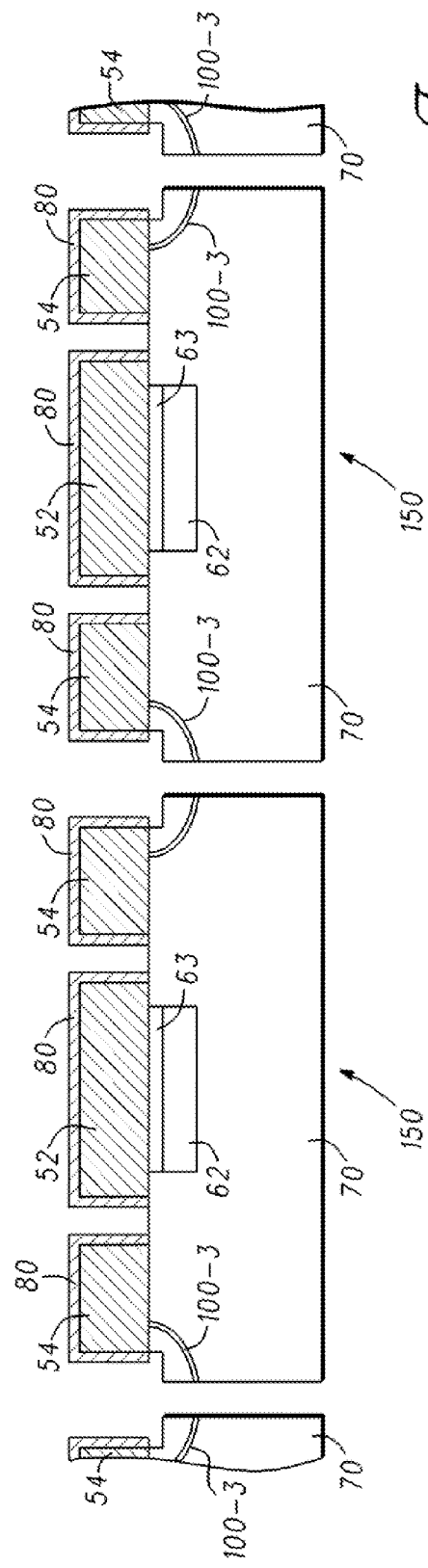

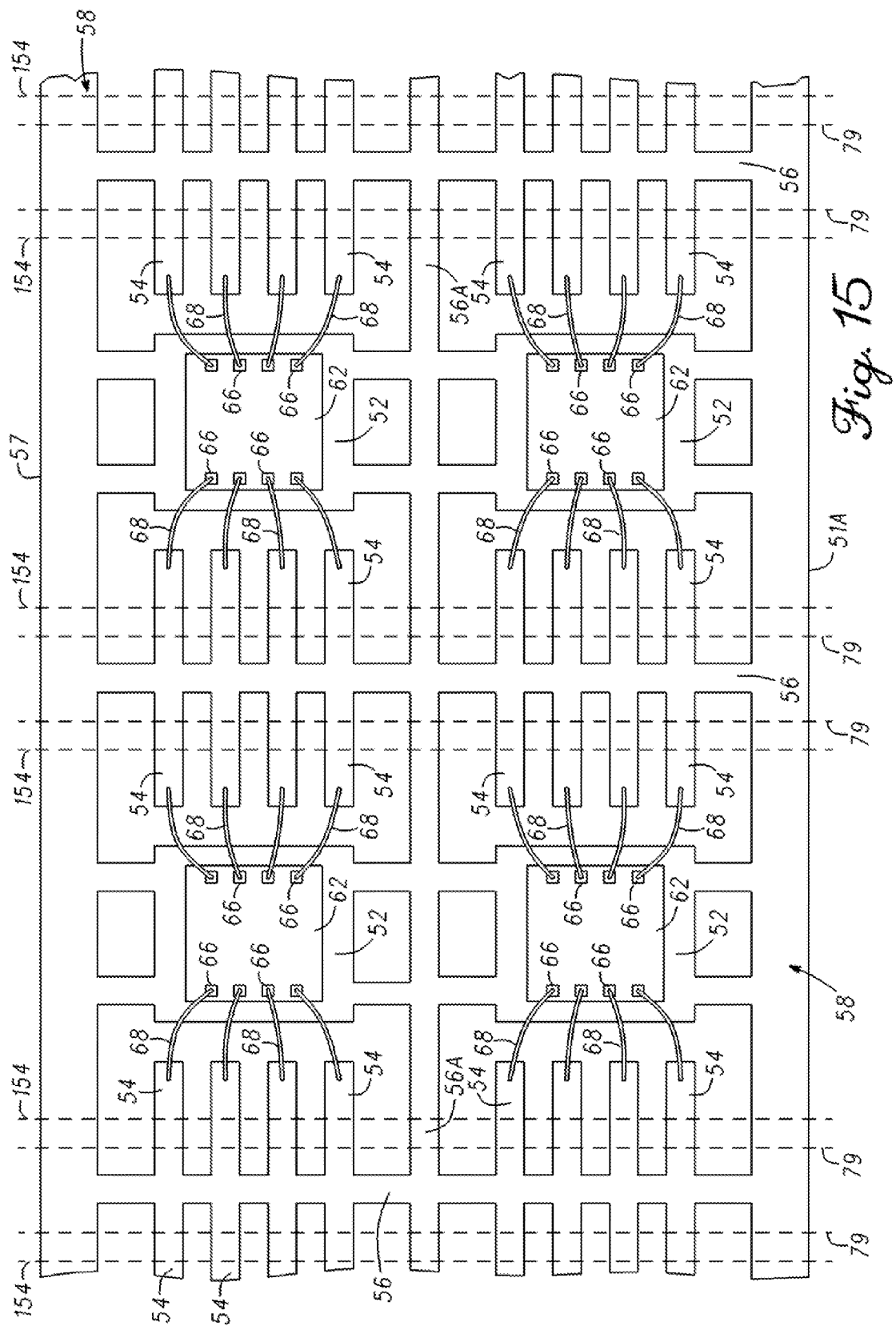

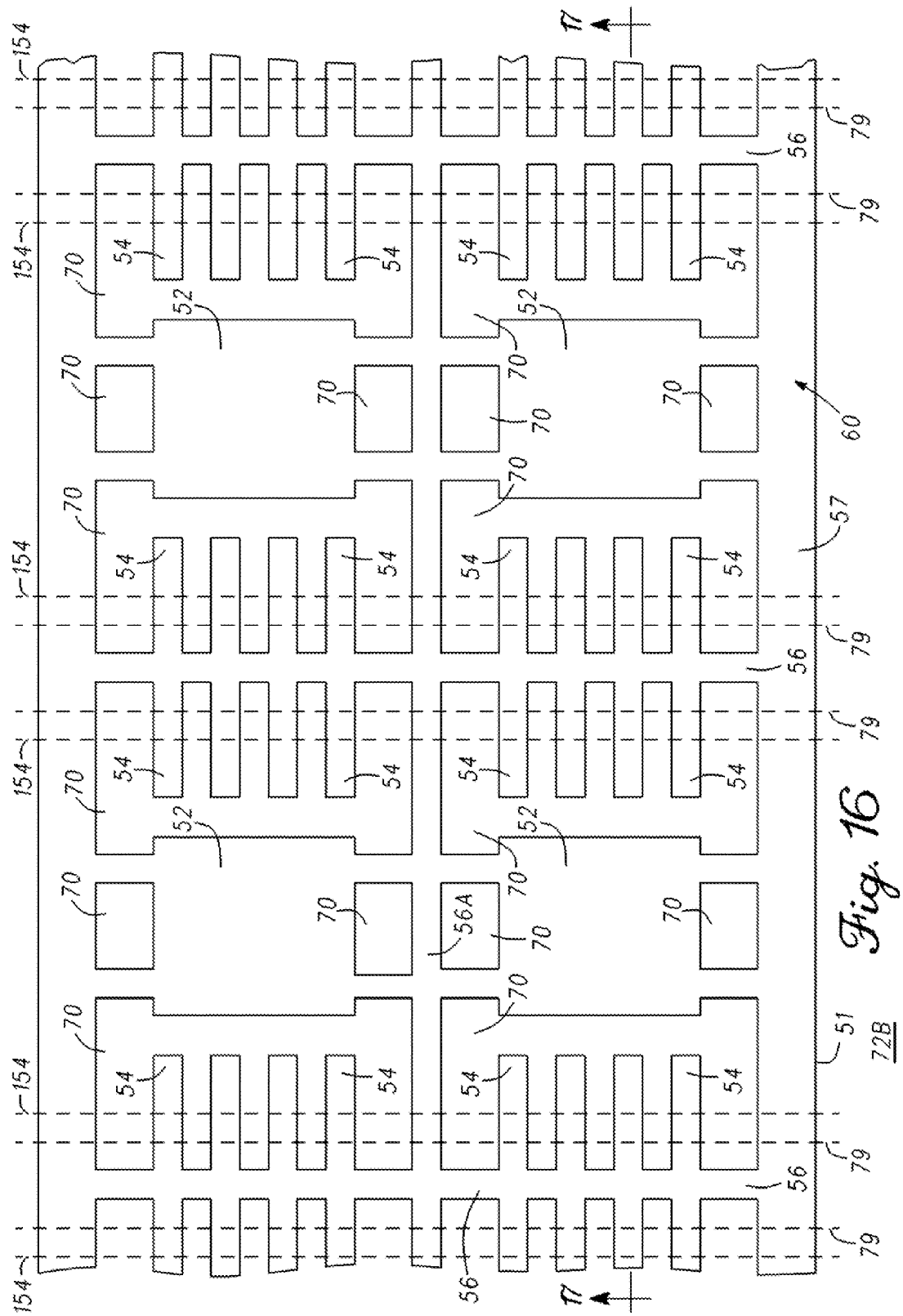

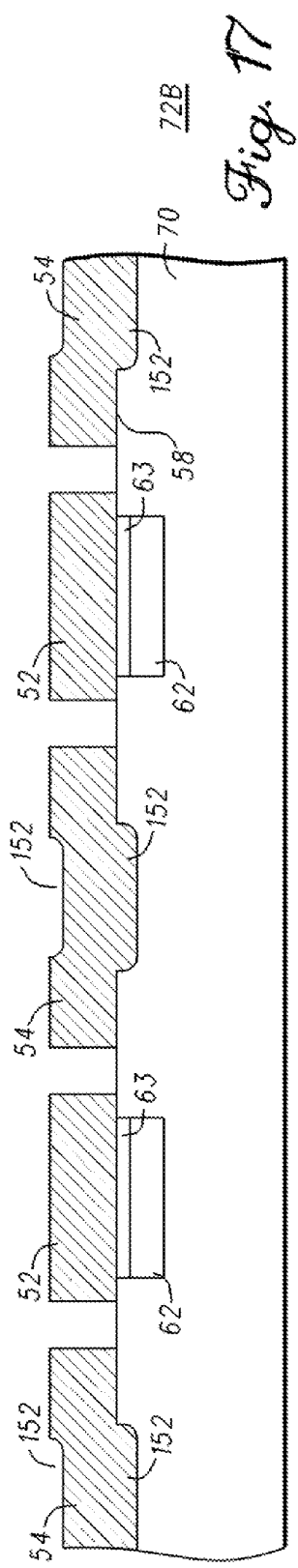
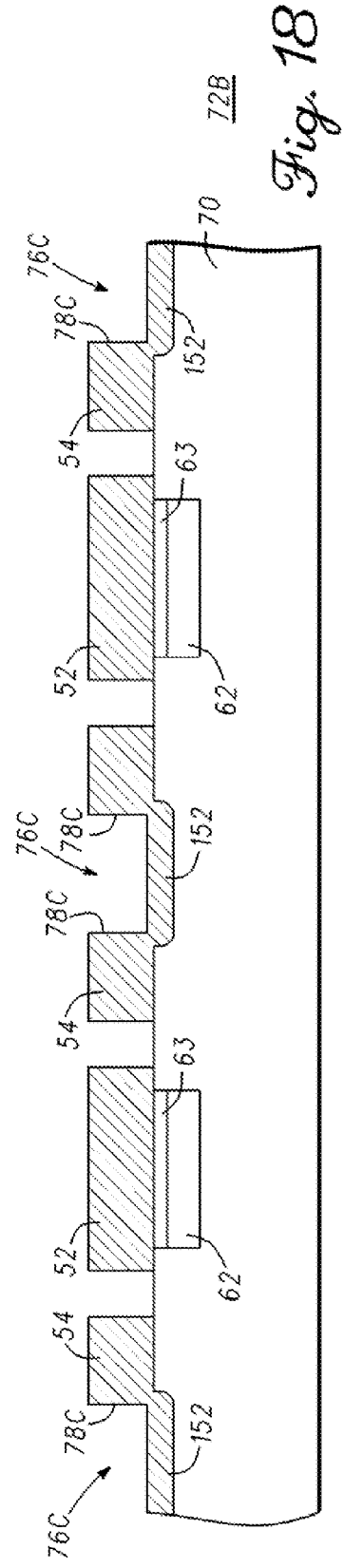
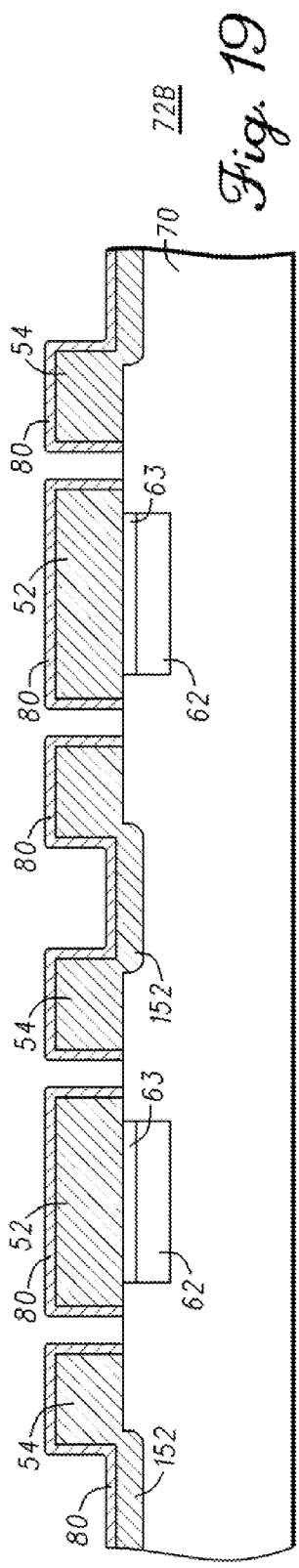

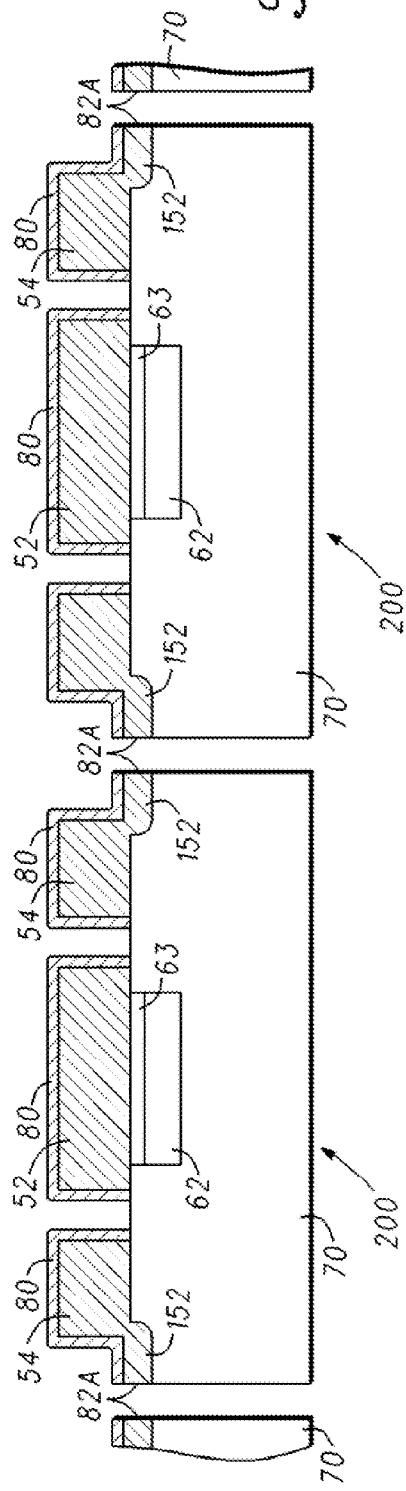
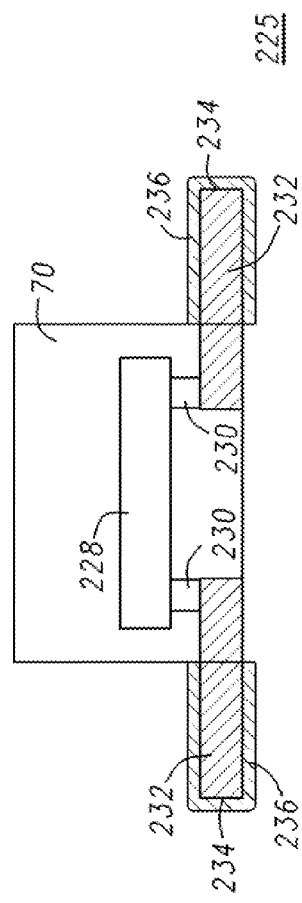

METHOD FOR MANUFACTURING A SEMICONDUCTOR COMPONENT AND STRUCTURE THEREFOR

TECHNICAL FIELD

The present invention relates, in general, to semiconductor components and, more particularly, to semiconductor component support structures.

BACKGROUND

Semiconductor devices are typically manufactured from a semiconductor wafer. The wafer is diced to form chips or dice, which are mounted to a substrate such as a leadframe. The leadframe is then placed in a mold and a portion of the leadframe is encapsulated in a mold compound whereas another portion of the leadframe remains unencapsulated. The leadframe leads are plated with tin and cut to separate the substrate into individual semiconductor components. A drawback with this approach is that cutting the leadframe leads leaves exposed portions of the leadframe material. The exposed portions may not wet during surface mount processes leading to corrosion creep during extreme atmospheric conditions such as those within an automotive engine compartment. In addition, the exposed portions of the leadframes may form unreliable solder joints.

Accordingly, it would be advantageous to have a semiconductor component having leadframe leads with improved wetability and a method for manufacturing the semiconductor component. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which:

FIG. 5 is a bottom view of the plurality of semiconductor components of FIG. 4 at a later stage of manufacture;

FIG. 6 is a cross-sectional view of the plurality of semiconductor components of FIG. 5 taken along section line 6-6 at a later stage of manufacture;

FIG. 7 is a cross-sectional view of the plurality of semiconductor components of FIG. 6 at a later stage of manufacture;

FIG. 8 is a cross-sectional view of the plurality of semiconductor components of FIG. 7 at a later stage of manufacture;

FIG. 9 is a side view of the plurality of semiconductor components of FIG. 8 at a later stage of manufacture;

FIG. 10 is a top view of a plurality of semiconductor components during manufacture in accordance with another embodiment of the present invention;

FIG. 11 is a cross-sectional view of the plurality of semiconductor components of FIG. 10 taken along section line 11-11 at a later stage of manufacture;

FIG. 12 is a cross-sectional view of the plurality of semiconductor components of FIG. 11 at a later stage of manufacture;

FIG. 13 is a cross-sectional view of the plurality of semiconductor components of FIG. 12 at a later stage of manufacture;

FIG. 14 is a cross-sectional view of the plurality of semiconductor components of FIG. 13 at a later stage of manufacture;

FIG. 15 is a top view of a plurality of semiconductor components during manufacture in accordance with another embodiment of the present invention;

FIG. 16 is a bottom view of the plurality of semiconductor components of FIG. 15 at a later stage of manufacture;

FIG. 17 is a cross-sectional view of the plurality of semiconductor components of FIG. 16 taken along section line 17-17 at a later stage of manufacture;

FIG. 18 is a cross-sectional view of the plurality of semiconductor components of FIG. 17 at a later stage of manufacture;

FIG. 19 is a cross-sectional view of the plurality of semiconductor components of FIG. 18 at a later stage of manufacture;

FIG. 20 is a side view of the plurality of semiconductor components of FIG. 19 at a later stage of manufacture; and FIG. 21 is a cross-sectional view of a semiconductor component in accordance with another embodiment of the present invention.

DETAILED DESCRIPTION

Figure 1:
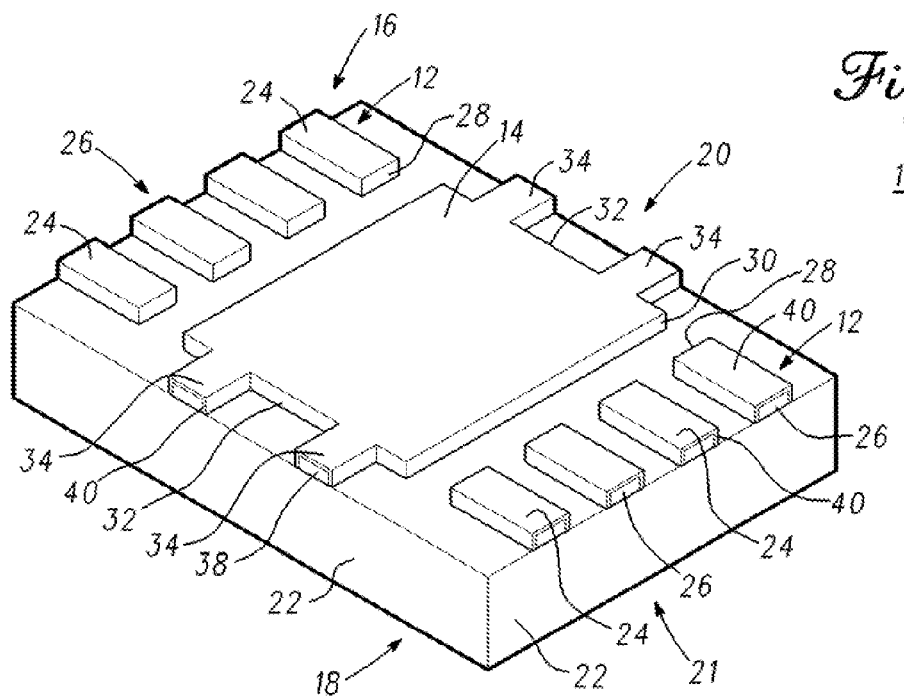
FIG. 1 is an isometric view of a semiconductor component during manufacture in accordance with an embodiment of the present invention.

FIG. 1 is an isometric view of a semiconductor component 10 during manufacture in accordance with an embodiment of the present invention. What is shown in FIG. 1 are leadframe leads 12 and a leadframe flag 14 of a leadframe 16 partially embedded in a mold compound 18, which has sides 20 and 21 and edges or side surfaces 22. Leadframe leads 12 and leadframe flag 14 protrude or extend from side 20. Preferably, lead frame 16 is copper. However, this is not a limitation of the present invention. Other suitable materials for leadframe 16 include copper alloys, steel, iron, or the like. Leadframe leads 12 are shown as being rectangular cuboids having side surfaces 24 and end surfaces 26 and 28. Leadframe flag 14 is a rectangular cuboid having side surfaces 30, end surfaces 32, and extensions 34 extending from end surfaces 32. The shapes of the leadframe flag and leadframe leads are not limited to having a rectangular cuboid shape. Other shapes for the leadframe flag and leadframe leads include circular, oval, square, triangular, pentagonal, or any other geometric shape. Extensions 34 have end surfaces 38. A layer of electrically conductive material 40 is formed over leadframe leads 12 and flag 14. Electrically conductive material 40 may be tin, lead, solder, a combination of tin and lead, or the like. Electrically conductive material 40 is absent from end surfaces 26 of leadframe leads 12 and end surfaces 38 of extensions 34. Thus, end surfaces 26 and 38 are exposed regions of leadframe leads 12. When leadframe 16 is copper, end surfaces 26 and 38 are exposed regions of copper. By way of example, end surfaces 26 and 38 are exposed when semiconductor components 10 are separated or singulated from a leadframe strip (not shown).

Figure 2:
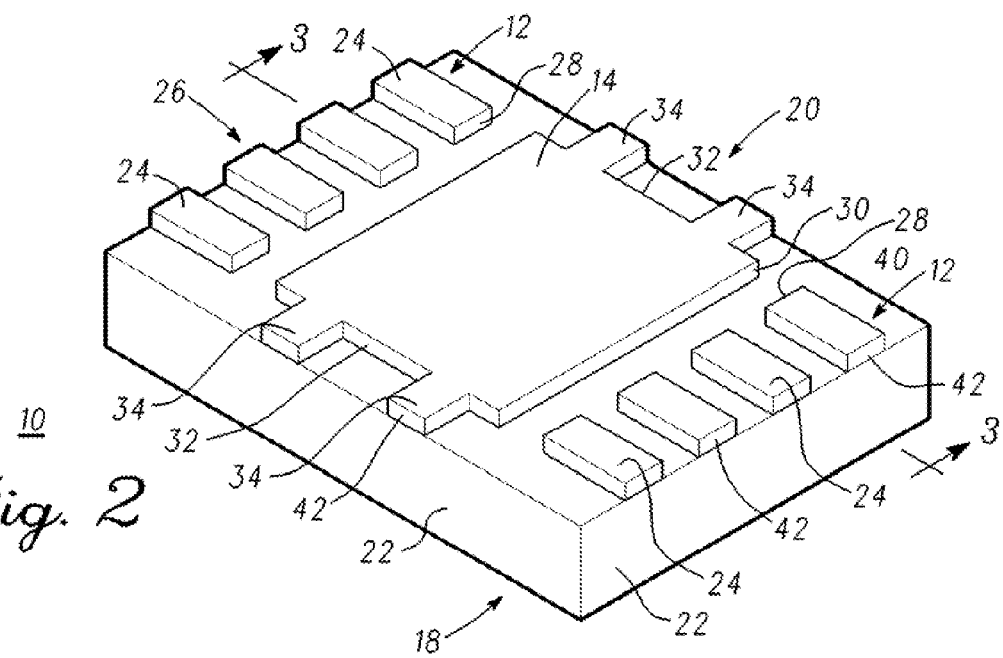
FIG. 2 is an isometric view the semiconductor component of FIG. 1 at a later stage of manufacture.

Referring now to FIG. 2, an electrically conductive material 42 is formed on electrically conductive layer 40 and on end surfaces 26 and 38 using, for example, a barrel plating process. Layers 40 and 42 are further illustrated in FIG. 3. In accordance with an embodiment, the material of electrically conductive layer 42 is tin. The material of electrically conductive layer 42 is not a limitation of the present invention. Other suitable materials for electrically conductive layer 42 include lead; solder; a combination of tin and lead; silver; nickel; a combination of nickel, lead, and gold; or the like. Similarly, the method for forming electrically conductive layer 42 is not a limitation of the present invention. Other suitable methods for forming electrically conductive layer 42 include electroplating, electroless plating, wave soldering, a hot solder dip, vapor deposition, sputter deposition, or the like. Layer of electrically conductive material 42 may cover or partially cover surfaces 26 and 38. An advantage of forming layers of electrically conductive material 42 is that it forms a wetable material over surfaces 26 and 38.

Figure 3:
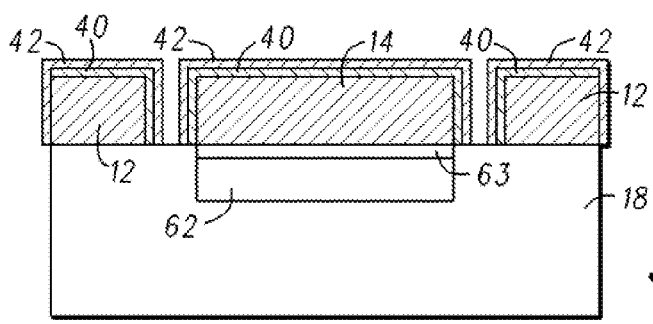
FIG. 3 is a cross-sectional view of the semiconductor component of FIG. 2 taken along section line 3-3 of FIG. 2.

FIG. 3 is a cross-sectional view of semiconductor component 10 taken along section line 3-3 of FIG. 2. FIG. 3 further illustrates leadframe leads 12, flag 14, and electrically conductive layers 40 and 42. For the sake of completeness, a semiconductor chip 62 is shown as being mounted to leadframe flag 14 through a die attach material 63.

Figure 4:
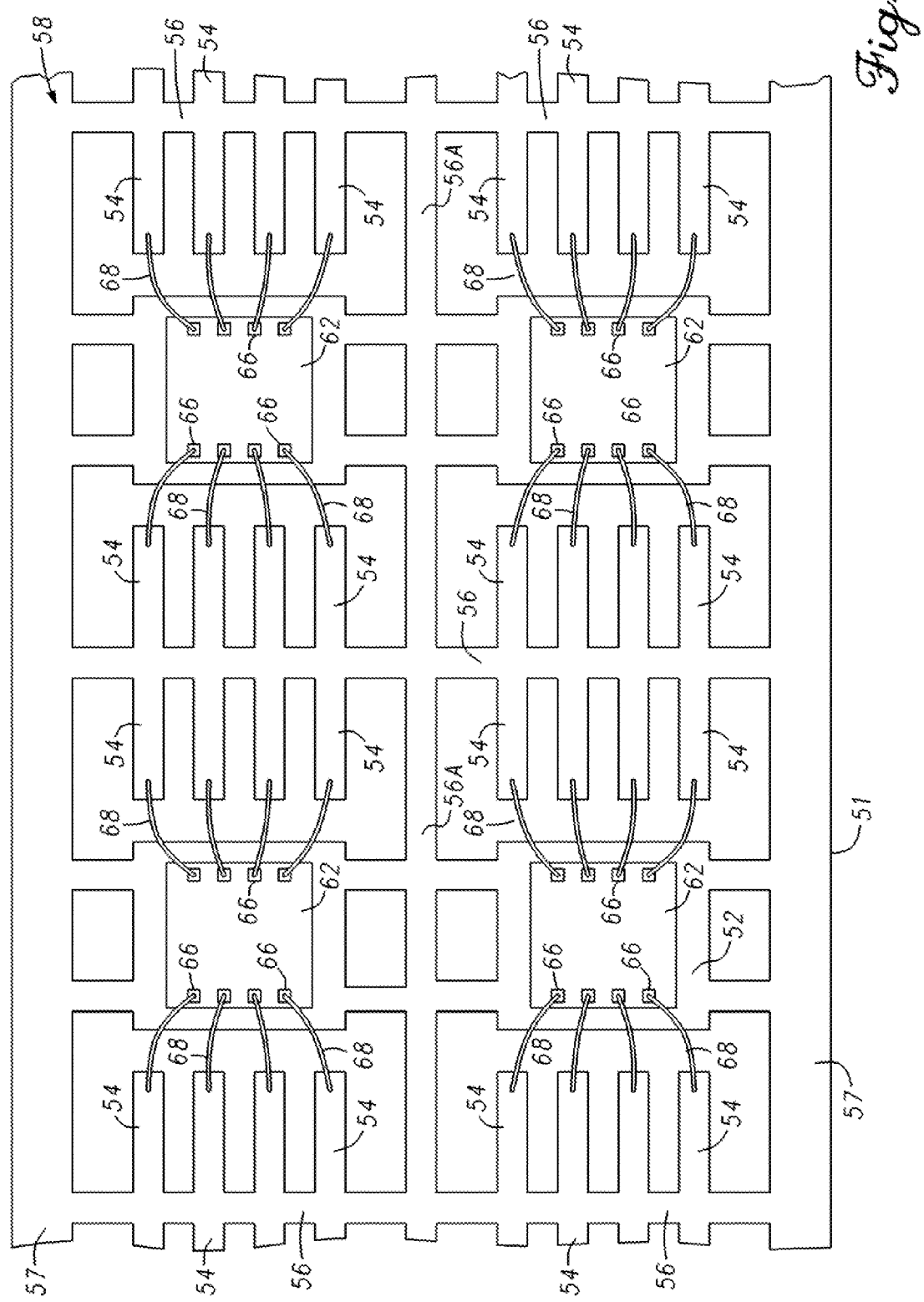
FIG. 4 is a top view of a plurality of semiconductor components during manufacture in accordance with another embodiment of the present invention.

FIG. 4 is a top view of a portion of an electrically conductive support 51 having device or component receiving areas 52, interconnect structures 54, structural support members 56, 56A, and 57, and opposing sides 58 and 60 (opposing side 60 is illustrated in FIG. 5) used in the manufacture of semiconductor components 50 (shown in FIG. 9). Interconnect structures 54 are also referred to as electrical interconnect structures or electrically conductive interconnect structures. It should be noted that the term top view is used for the sake of clarity and to distinguish the side of electrically conductive support 51 to which one or more active circuit elements or one or more passive circuit elements is mounted. In accordance with an embodiment, electrically conductive support 51 is a leadframe, interconnect structures 52 are flags, interconnect structures 54 are leadframe leads, support members 56 and 56A are tie bars, and support members 57 are rails. By way of example, semiconductor chips or dice 62 are coupled to side 58 of leadframe 51 through a die attach material 63 (shown in FIG. 6). More particularly, a semiconductor chip 62 is mounted to each flag 52 through the die attach material. Semiconductor chips 62 have bond pads 66 that are coupled to corresponding leadframe leads 54 through bond wires 68. Bond wires are also referred to as wirebonds. The number of flags and leadframe leads and their shapes are not limitations of the present invention. Although semiconductor chips 62 have been described as being mounted to flags 52, the embodiments are not limited in this respect. Passive circuit elements such as resistors, inductors, and capacitors as well as active circuit elements such as semiconductor chips comprising transistors may be coupled to or mounted on leadframe 51 in place of or in addition to semiconductor chips 62.

Referring now to FIG. 5, a bottom view of a portion of leadframe 51 after a mold compound 70 has been formed over semiconductor chips 62 and wirebonds 68 to form a molded leadframe strip 72 is shown. It should be understood that mold compound 70 is formed over side 58, i.e., the top side, leaving side 60 substantially free of mold compound and that FIG. 5 is a bottom view of leadframe 51. It should be further understood that referring to the views shown in the figures as top views and bottom views and the designation of a view as being a top view or a bottom view is merely to facilitate describing embodiments of the present invention. Broken lines 79 indicate where portions of leadframe leads 54 will be separated and exposed. Broken lines 79 also indicate the regions in which tie bars 56 are removed. Separating and exposing leadframe leads 54 and removing tie bars 56 are further described with reference to FIG. 7.

FIG. 6 is a cross-sectional view of molded leadframe strip 72 taken along section line 6-6 of FIG. 5. FIG. 6 illustrates portions of leadframe flags 52, leadframe leads 54, die attach material 63, and semiconductor chips 62.

FIG. 7 is a cross-sectional view of molded leadframe strip 72 shown in FIG. 6 at a later stage of manufacture. What is shown in FIG. 7 is leadframe 51 after portions have been removed. More particularly, portions of leadframe leads 54 and tie bars 56 are removed to form cavities 76 having sidewalls 78. By way of example, the portions of leadframe leads 54 and tie bars 56 are removed by partially sawing into leadframe leads 54 and tie bars 56. Preferably, the thickness of leadframe leads 54 and tie bars 56 that are removed ranges from about 50 percent (%) to about 100% of the thicknesses of leadframe leads 54 and tie bars 56. However, the thicknesses of leadframe leads 54 and tie bars 56 that are removed may be less than 50% and equal to or greater than 100% of their thicknesses. In accordance with an embodiment, about three-fourths of the thickness of leadframe leads 54 and tie bars 56 is removed. Suitable techniques for removing the portions of leadframe leads 54 include sawing, cutting, etching, stamping, punching, or the like. The regions at which the portions of leadframe leads 54 and tie bars 56 are removed are shown in FIG. 5 and identified by broken lines 79.

Referring now to FIG. 8, a layer of electrically conductive material 80 having a thickness ranging from about 0.5 microinches (12.7 nanometers) to about 3,000 microinches (76.2 micrometers) is formed on leadframe leads 54, including the portions of leadframe leads 54 within cavities 76. In accordance with an embodiment, electrically conductive material 80 is tin formed by an electroplating process. The type of electrically conductive material and the method for forming the electrically conductive material are not limitations of the present invention. Other suitable materials for electrically conductive layer 80 include silver; nickel; a combination of nickel, lead, and gold; or the like. Similarly, the method for forming electrically conductive layer 80 is not a limitation of the present invention. Other suitable methods for forming electrically conductive layer 80 include electroplating, electroless plating, wave soldering, a hot solder dip, vapor deposition, sputter deposition, or the like.

Although the examples for the material for electrically conductive layer 80 have been metals, this is not a limitation of the present invention. For example, layer 80 may be a conductive epoxy. Alternatively, an anti-oxidizing coating or agent may be formed over leadframe leads 54 and on the exposed portions of leadframe leads 54. These types of coatings are electrically non-conductive materials that inhibit the oxidation of metals such as copper at room temperature. During the formation of solder over leadframe leads 54, the anti-oxidizing coating evaporates allowing solder to form on the exposed portions of leadframe leads 54. The anti-oxidizing coating leaves a clean wetable copper surface after it has evaporated to which solder can adhere.

Referring now to FIG. 9, portions of leadframe leads 54 and tie bars 56 remaining in cavities 76 are removed exposing sidewall portions 82 of leadframe leads 54 and portions of mold compound 70, and singulating molded leadframe strip 72 into individual semiconductor components 50. In embodiments in which cavities 76 are formed using a sawing process and molded leadframe strip 72 is singulated using a sawing process, preferably the width of the saw blade used to singulate molded leadframe strip 72 is less than the width of the saw blade used to form cavities 76. The remaining portions of electrically conductive layer 80 provide a wetable material over portions of the surfaces of leadframe leads 54.

FIG. 10 is a top view of a leadframe 51 having flags 52, leadframe leads 54, tie bars 56 and 56A, and opposing sides 58 and 60. Leadframe leads 54 are comprised of leadframe leads 54A-1, 54B-1, 54A-2, 54B-2, 54A-3, 54B-3, 54A-4, and 54B-4, wherein leadframe leads 54A-1 and 54B-1 are on directly opposite sides of tie bars 56, leadframe leads 54A-2 and 54B-2 are on directly opposite sides of tie bars 56, leadframe leads 54A-3 and 54B-3 are on directly opposite sides of tie bars 56, and leadframe leads 54A-4 and 54B-4 are on directly opposite sides of tie bars 56. Semiconductor chips or dice 62 are coupled to side 58 of leadframe 51 through a die attach material 63. More particularly, a semiconductor chip 62 is mounted to each flag 52 through die attach material 63. Semiconductor chips 62 have bond pads 66 that are coupled to corresponding leadframe leads 54 through bond wires 68. Bond wires are also referred to as wirebonds. The number of flags 52 and leadframe leads 54 per leadframe are not limitations of the present invention.

Wirebonds 100-1, 100-2, 100-3, and 100-4 are formed to electrically couple leadframe leads 54A-1, 54A-2, 54A-3, and 54A-4 with leadframe leads 54B-1, 54B-2, 54B-3, and 54B-4, respectively. Wirebonds 102 are formed to electrically couple leadframe leads 54A-1, 54A-2, 54A-3, and 54A-4 to each other and wirebonds 104 are formed to electrically couple leadframe leads 54A-1, 54A-2, 54A-3, 54A-4, 54B-1, 54B-2, 54B-3, and 54B-4 to at least one of rails 57. Alternatively, wirebonds 102 can be formed to electrically couple leadframe leads 54B-1, 54B-2, 54B-3, and 54B-4 to each other. Wirebonds 100-1, 100-2, 100-3, 100-4, 102, and 104 form electrical connections between leadframe leads 54 and rails 57 during the plating process. The use of wirebonds for electrically connecting leadframe leads 54, tie bars 56, and rails 57 is not a limitation of the present invention. For example, conductive clips may be used to electrically connect leadframe leads 54, tie bars 56, and rails 57.

Like semiconductor components 10 and 50, a mold compound 70 (shown in FIGS. 11-14) is formed over semiconductor chips 62 and wirebonds 68, 100-1, 100-2, 100-3, 100-4, 102, and 104 to form a molded leadframe strip 72A (shown in FIGS. 11-13) that is similar to molded leadframe strip 72. It should be noted that a bottom view of a molded leadframe strip for semiconductor component 150 is similar to the bottom view of molded leadframe strip 72 shown in FIG. 5. A bottom view of the molded leadframe strip is similar to the bottom view shown in FIG. 5. As described above, referring to the views shown in the figures as top views and bottom views and the designation of a view as being a top view or a bottom view is merely to facilitate describing embodiments of the present invention.

FIG. 11 is a cross-sectional view of molded leadframe strip 72A taken along the region shown by section line 11-11 of FIG. 10 but at a later step than that shown in FIG. 10. FIG. 11 illustrates portions of leadframe flags 52, leadframe leads 54, die attach material 63, semiconductor chips 62, and wirebonds 100-3.

FIG. 12 is a cross-sectional view of molded leadframe strip 72A shown in FIG. 11 but at a later stage of manufacture than the molded leadframe strip shown in FIG. 11. What is shown in FIG. 12 is molded leadframe strip 72A after portions of leadframe 51 and mold compound 70 have been removed. More particularly, portions of leadframe leads 54 and mold compound 70 are removed to form cavities 76A having sidewalls 78A. By way of example, the portions of leadframe leads 54 are removed by sawing into leadframe leads 54, tie bars 56, and mold compound 70. The method for removing leadframe leads 54, tie bars 56 and mold compound 70 is not a limitation of the present invention. Other suitable techniques for removing the portions of leadframe leads 54 include sawing, cutting, etching, stamping, punching, or the like. The regions at which the portions of leadframe leads 54, tie bars 56, and rails 57 are removed are identified by broken lines 79 shown in FIG. 10.

Referring now to FIG. 13, a layer of electrically conductive material 80 having a thickness ranging from about 0.5 microinches (12.7 nanometers) to about 3,000 microinches (76.2 micrometers) is formed on leadframe leads 54, including the portions of leadframe leads 54 within cavities 76A. In accordance with an embodiment, electrically conductive material 80 is tin formed by an electroplating process. The type of electrically conductive material and the method for forming the electrically conductive material are not limitations of the present invention. Other suitable materials for electrically conductive layer 80 include silver; nickel; a combination of nickel, lead, and gold; or the like. Similarly, the method for forming electrically conductive layer 80 is not a limitation of the present invention. Other suitable methods for forming electrically conductive layer 80 include electroplating, electroless plating, wave soldering, a hot solder dip, vapor deposition, sputter deposition or the like.

As discussed above, electrically conductive layer 80 is not limited to being a metal, but can be a conductive epoxy or an anti-oxidizing coating or agent formed over leadframe leads 54 and on the exposed portions of leadframe leads 54. These types of coatings are electrically non-conductive materials that inhibit the oxidation of metals such as copper at room temperature. During the formation of solder over leadframe leads 54, the anti-oxidizing coating evaporates allowing solder to form on the exposed portions of leadframe leads 54. The anti-oxidizing coating leaves a clean wetable copper surface after it has evaporated to which solder can adhere.

Referring now to FIG. 14, portions of leadframe leads 54 and tie bars 56 remaining in cavities 76A and portions of mold compound 70 are removed forming sidewalls from mold compound 70 and singulating molded leadframe strip 72A into individual semiconductor components 150, i.e., the portions of mold compound 70 exposed by removing the portions of leadframe leads 54 and tie bars 56 are removed to singulate molded leadframe strip 72A into individual semiconductor components 150. In addition, wire bonds 100-1, 100-2, 100-3, 100-4, 102, and 104 are cut, opened, or separated. It should be noted that in embodiments in which wire bonds 102 and 104 are opened using a sawing or cutting process, wire bonds 102 and 104 are cut in a direction substantially perpendicular to wire bonds 100-1, 100-2, 100-3, 100-4. The remaining portions of electrically conductive layer 80 provide a wetable material over surfaces of leadframe leads 54.

FIG. 15 is a top view of a portion of a leadframe 51A having a flag 52, leadframe leads 54, tie bars 56 and 56A, rails 57, and opposing sides 58 and 60 (opposing side 60 is illustrated in FIG. 16) used in the manufacture of semiconductor components 200 (shown in FIG. 20). Leadframe 51A is similar to leadframe 51 described with reference to FIG. 4 except that dimples 152 are formed in tie bars 56. Because of this difference, the reference character "A" has been appended to reference character 51. Dimples 152 may be formed by stamping the tie bars of leadframe 51A. The locations of dimples 152 are illustrated by broken lines 154 in FIG. 14. Dimples 152 are shown in FIGS. 17-20. Semiconductor chips or dice 62 are coupled to side 58 of leadframe 51A and bond pads 66 are coupled to corresponding leadframe leads 54 through bond wires 68 as described with reference to FIG. 4. Alternatively and as discussed with reference to FIG. 3, passive circuit elements such as resistors, capacitors, and inductors or other active circuit elements may be coupled to or mounted on leadframe 51A in place of or in addition to semiconductor chips 62.

Referring now to FIG. 16, a bottom view of a portion of leadframe 51 after a mold compound 70 has been formed over semiconductor chips 62 and wirebonds 68 to form a molded leadframe strip 72B. Broken lines 154 indicate where dimples 152 are formed in leadframe 51A. It should be understood that mold compound 70 is formed over side 58, i.e., the top side, leaving side 60 substantially free of mold compound and that FIG. 16 is a bottom view of leadframe 51A. It should be further understood that referring to the views shown in the figures as top views and bottom views and the designation of a view as being a top view or a bottom view is merely to facilitate describing embodiments of the present invention. Broken lines 79 indicate where portions of leadframe leads 54 are separated and exposed. Broken lines 79 also indicate the regions in which tie bars 56 are removed. The acts of separating and exposing leadframe leads 54 and removing tie bars 56 are further described with reference to FIG. 18.

A mold compound 70 is formed over semiconductor chips 62 and wirebonds 68 to form a molded leadframe strip 72B as described with reference to FIG. 5. Like FIG. 5, FIG. 16 is a bottom view of molded leadframe strip 72B. The locations of dimples 152 are illustrated by broken lines 154. As discussed above, dimples 152 are shown with reference to FIGS. 17-20. Broken lines 79 indicate where portions or regions of leadframe leads 54 are separated and exposed.

FIG. 17 is a cross-sectional view of molded leadframe strip 72B taken along section line 17-17 of FIG. 16. FIG. 17 illustrates portions of leadframe flags 52, leadframe leads 54, die attach material 63, semiconductor chips 62, and dimples 152.

FIG. 18 is a cross-sectional view of molded leadframe strip 72B shown in FIG. 17 at a later stage of manufacture. What is shown in FIG. 18 is molded leadframe strip 72B after portions of leadframe 51A have been removed to form cavities 76C having sidewalls 78C. By way of example, the portions of leadframe leads 54 are removed by partially sawing into leadframe leads 54 and tie bars 56. Preferably, the thicknesses of leadframe leads 54 and tie bars 56 that are removed is less than about 100% of the thickness of leadframe leads 54. In accordance with an embodiment, about three-fourths of the thicknesses of leadframes 54 and tie bars 56 are removed. Suitable techniques for removing the portions of leadframe leads 54 include sawing, cutting, etching, stamping, punching, or the like. The regions at which the portions of leadframe leads 54, tie bars 56, and rails 57 are removed are identified by broken lines 79 shown in FIGS. 15 and 16.

Referring now to FIG. 19, a layer of electrically conductive material 80 having a thickness ranging from about 0.5 microinches (12.7 nanometers) to about 3,000 microinches (76.2 micrometers) is formed on leadframe leads 54, including the portions of leadframe leads 54 within cavities 76C. In accordance with an embodiment, electrically conductive material 80 is tin formed by an electroplating process. The type of electrically conductive material and the method for forming the electrically conductive material are not limitations of the present invention. Other suitable materials for electrically conductive layer 80 include silver; nickel; a combination of nickel, lead, and gold; or the like. Similarly, the method for forming electrically conductive layer 80 is not a limitation of the present invention. Other suitable methods for forming electrically conductive layer 80 include electroplating, electroless plating, wave soldering, a hot solder dip, vapor deposition, sputter deposition, or the like.

As discussed above, electrically conductive layer 80 is not limited to being a metal, but can be a conductive epoxy or an anti-oxidizing coating or agent formed over leadframe leads 54 and on the exposed portions of leadframe leads 54. These types of coatings are electrically non-conductive materials that inhibit the oxidation of metals such as copper at room temperature. During the formation of solder over leadframe leads 54, the anti-oxidizing coating evaporates allowing solder to form on the exposed portions of leadframe leads 54. The anti-oxidizing coating leaves a clean wetable copper surface after it has evaporated to which solder can adhere.

Referring now to FIG. 20, portions of leadframe leads 54 and tie bars 56 remaining in cavities 76C are removed exposing sidewall portions of electrically conductive layer 80, sidewall portions 82A of leadframe leads 54, and portions of mold compound 70, and singulating molded leadframe strip 72B into individual semiconductor components 200. In embodiments in which cavities 76C are formed using a sawing process and molded leadframe strip 72B are singulated using a sawing process, preferably the width of the saw blade used to singulate molded leadframe strip 72B is less than the width of the saw blade used to form cavities 76C. The remaining portions of electrically conductive layer 80 provide a wetable material over surfaces of leadframe leads 54.

Referring now to FIG. 21, a cross-sectional view of a semiconductor component 225 is illustrated. Semiconductor component 225 includes a semiconductor chip 228 having bond pads 230 mounted to leadframe leads 232 and protected by a mold compound 70. A material 236 is formed on edges 234 of leadframe leads 232 that were exposed after singulation. Material 236 may be an electrically conductive material or an anti-oxidizing material. Although material 236 is shown as covering all of edges 234, this is not a limitation of the present invention. Material 236 may cover less than the entirety of edges 234. It should be noted that flags are absent from semiconductor component 225.

Although certain preferred embodiments and methods have been disclosed herein, it will be apparent from the foregoing disclosure to those skilled in the art that variations and modifications of such embodiments and methods may be made without departing from the spirit and scope of the invention. For example, the electrically conductive support structure may be a flagless structure. It is intended that the invention shall be limited only to the extent required by the appended claims and the rules and principles of applicable law.

What is claimed is:

1. A method for manufacturing a semiconductor component, comprising:

providing one or more electrical interconnect structures partially embedded in a mold compound, the one or more electrical interconnect structures having first and second major surfaces and a plurality of edges coupling the first major surface to the second major surface;

exposing a portion of a first edge of the plurality of edges of at least one of the one or more electrical interconnect structures;

forming a first material over a sub-portion of the exposed portion of the first edge; providing a leadframe having a tie bar with first and second leadframe leads extending from opposing sides of the tie bar; forming a wirebond from the first leadframe lead to the second leadframe lead, and separating the mold compound into at least two portions, wherein the separating includes cutting and separating the wirebond.

2. The method of claim 1, wherein forming the first material over the sub-portion of the exposed portion of the first edge comprises plating the first material onto the exposed portion of the first edge of the at least one electrical interconnect structure.

3. The method of claim 1, wherein exposing the portion of the first edge of the plurality of edges of the at least one of the one or more electrical interconnect structures comprises sawing the at least one electrical interconnect structure.

4. The method of claim 1, wherein separating the mold compound into at least two portions includes sawing through the mold compound.

5. The method of claim 1, wherein exposing the portion of the first edge of the plurality of edges of the at least one of the one or more electrical interconnect structures comprises stamping the one or more electrical interconnect structures.

6. The method of claim 1, wherein exposing the portion of the first edge of the plurality of edges of the at least one of the one or more electrical interconnect structures comprises etching the one or more electrical interconnect structures.

7. The method of claim 1, wherein forming the first material over a sub-portion of the exposed portion of the first edge includes forming an electrically conductive material over the exposed portion.

8. The method of claim 7, wherein forming the first material over a sub-portion of the exposed portion of the first edge includes forming an anti-oxidizing coating over the exposed portion.

9. The method of claim 1, wherein forming the first material over the sub-portion of the exposed portion of the first edge includes barrel plating the first material over the sub-portion of the exposed portion of the first edge.

10. The method of claim 1, wherein providing the one or more electrical interconnect structures embedded in the mold compound includes:
providing a leadframe having a tie bar with first and second leadframe leads extending from opposing sides of the tie bar;
further including forming a dimple in at least a portion of the tie bar.

11. The method of claim 10, wherein forming the dimple comprises stamping the portion of the tie bar.

12. A method for manufacturing a semiconductor component, comprising:
providing a leadframe partially embedded in a molding compound having first and second major surfaces and a plurality of leadframe leads, wherein each of the plurality of leadframe leads has an edge coupling the first major surface to the second major surface;
exposing a portion of a first edge of at least one leadframe lead of the plurality of leadframe leads;
forming a first layer of conductive material on at least a sub-portion of the exposed portion of the first edge of the at least one leadframe lead of the plurality of leadframe leads, wherein the leadframe includes a tie bar with first and second leadframe leads extending from opposing sides of the tie bar, and further includes forming a wirebond from the first leadframe lead to the second leadframe lead or forming a dimple in the tie bar, and separating the mold compound into at least two portions, wherein the separating includes cutting and separating the wirebond.

13. The method of claim 12, further including forming a second layer of electrically conductive material on the exposed portion of the first edge of the at least one leadframe lead followed by exposing the portion of the at least one leadframe lead.

14. The method of claim 13, wherein exposing the portion of the first edge of the at least one leadframe lead of the plurality of leadframe leads includes using a method selected from the group of methods comprising sawing the leadframe, etching the leadframe, stamping the leadframe, and nicking the leadframe.

* * * * *